(12) United States Patent
Atoro et al.

(10) Patent No.: US 8,332,171 B2
(45) Date of Patent: Dec. 11, 2012

(54) WAVEFORM OBSERVING APPARATUS

(75) Inventors: Takashi Atoro, Osaka (JP); Yohei Okawa, Osaka (JP)

(73) Assignee: Keyence Corporation, Osaka (JP)

( * ) Notice: Subject to any disclaimer, the term of this patent is extended or adjusted under 35 U.S.C. 154(b) by 753 days.

(21) Appl. No.: 12/502,484

(22) Filed: Jul. 14, 2009

(65) Prior Publication Data

US 2010/0036631 A1   Feb. 11, 2010

(30) Foreign Application Priority Data

Aug. 8, 2008   (JP) ................................ 2008-205828

(51) Int. Cl.
| | |
|---|---|
| *G01R 13/02* | (2006.01) |
| *G06F 19/00* | (2006.01) |
| *G09G 5/22* | (2006.01) |
| *G06K 9/46* | (2006.01) |

(52) U.S. Cl. ....... 702/67; 702/189; 345/440.1; 382/232; 708/203

(58) Field of Classification Search .................... 702/67, 702/189; 345/440.1; 382/232; 708/203
See application file for complete search history.

(56) References Cited

FOREIGN PATENT DOCUMENTS

| JP | 07-114349 | 5/1995 |
|---|---|---|
| JP | 2002-082133 | 3/2002 |
| JP | 2003-307530 | * 10/2003 |

* cited by examiner

*Primary Examiner* — Cindy H Khuu
*Assistant Examiner* — L. Anderson
(74) *Attorney, Agent, or Firm* — Kilyk & Bowersox, P.L.L.C.

(57) ABSTRACT

There is provided a waveform observing apparatus, which facilitates management of compressed data and measured data that were created for a reduced display, reduces a calculating amount in making the reduced display, and displays a boundary between stoppage and start of collection of measured data in a visually observable manner, in such a manner that, when a compression ratio is set to the number of pieces of data per display dot, a plurality of compressed data of a compressed-data file for display with a smaller compression ratio than the above used to calculate compressed data, to make a reduced display at the compression ratio after the setting change, final compressed data is created based upon measured data of a fraction at the time of stoppage of sampling, top compressed data is created based upon measured data of a fraction immediately after resuming of the sampling at the time of the resuming.

3 Claims, 16 Drawing Sheets

FIG. 8

| Sampling cycle | Time/Div | | | | | | | | | | | | | | | | | |
|---|---|---|---|---|---|---|---|---|---|---|---|---|---|---|---|---|---|---|
| | 15s | 30s | 1min | 2min | 5min | 10min | 15min | 30min | 1h | 2h | 5h | 10h | 30h | 5day | 10day |
| 10ms | 50 | 100 | 200 | 400 | 1000 | 2000 | 3000 | ⋯⋯ | ⋯⋯ | ⋯⋯ | ⋯⋯ | 120000 | 360000 | 1440000 | 2880000 |
| 20ms | 25 | 50 | ⋯ | 200 | 500 | ⋯⋯ | 1500 | ⋯⋯ | ⋯⋯ | ⋯⋯ | ⋯⋯ | ⋯⋯ | ⋯⋯ | 720000 | 1440000 |
| 50ms | 10 | 20 | ⋯ | ⋯ | 200 | ⋯⋯ | 600 | ⋯⋯ | ⋯⋯ | ⋯⋯ | ⋯⋯ | ⋯⋯ | ⋯⋯ | ⋯⋯ | 576000 |
| 100ms | 5 | 10 | 20 | ⋯ | 100 | 200 | 300 | 600 | ⋯⋯ | ⋯⋯ | 2400 | 12000 | ⋯⋯ | ⋯⋯ | 288000 |
| 200ms | × | 5 | 10 | 20 | 50 | 100 | 150 | 300 | 600 | ⋯⋯ | 1200 | 6000 | ⋯⋯ | 72000 | 144000 |
| 500ms | × | 2 | 4 | 8 | 20 | ⋯ | 60 | 120 | 240 | ⋯⋯ | ⋯⋯ | ⋯⋯ | 7200 | ⋯⋯ | 57600 |
| 1s | × | 1 | 2 | 4 | 10 | ⋯ | 30 | 60 | 120 | ⋯⋯ | 1200 | ⋯⋯ | 3600 | ⋯⋯ | 28800 |
| 2s | × | × | 1 | 2 | 5 | 10 | 15 | ⋯ | 60 | 120 | 600 | 600 | ⋯⋯ | 7200 | 14400 |
| 5s | × | × | × | ⋯ | 2 | 4 | 6 | ⋯ | ⋯ | 48 | ⋯⋯ | 240 | ⋯⋯ | ⋯⋯ | 5760 |
| 10s | × | × | × | × | 1 | 2 | 3 | ⋯ | ⋯ | ⋯ | 120 | ⋯⋯ | 360 | ⋯⋯ | 2880 |
| 20s | × | × | × | × | × | 1 | × | ⋯ | ⋯ | 6 | 60 | ⋯ | 180 | 720 | 1440 |
| 30s | × | × | × | × | × | × | 1 | 1 | 2 | 4 | ⋯ | 30 | ⋯ | 480 | 960 |
| 1min | × | × | × | × | × | × | × | × | 1 | 2 | 8 | 20 | 40 | ⋯ | 480 |
| 2min | × | × | × | × | × | × | × | × | × | 1 | 4 | 10 | 20 | ⋯ | 240 |
| 5min | × | × | × | × | × | × | × | × | × | × | 2 | 5 | 10 | 30 | 96 |
| 10min | × | × | × | × | × | × | × | × | × | × | 1 | 2 | 4 | 12 | 48 |
| | | | | | | | | | | | | 1 | 2 | 6 | 24 |

Creation of compressed-display data file

WAVEFORM OBSERVING APPARATUS

CROSS-REFERENCE TO RELATED APPLICATIONS

The present application claims foreign priority based on Japanese Patent Application No. 2008-205828, filed Aug. 8, 2008, the contents of which is incorporated herein by reference.

BACKGROUND OF THE INVENTION

1. Field of the Invention

The present invention relates to a waveform observing apparatus.

2. Description of the Background Art

There has been used a waveform observing apparatus for observing a temperature and pressure of equipment on a factory production line. The apparatus historically used to be one for writing a waveform on rolled paper (chart), but with the development of electronic equipment, a waveform observing apparatus that displays a waveform by use of a display in place of paper is currently in wide use.

The waveform observing apparatus is capable of displaying in a display section a constantly varying measured value, namely a time-series waveform, while storing measured data captured from a thermocouple or the like into a memory mounted to the waveform observing apparatus. For example, Japanese Patent Application Laid-Open No. H7-114349 and Japanese Patent Application Laid-Open No. 2002-82133 each disclose a waveform observing apparatus having a display with a touch panel. Japanese Patent Application Laid-Open No. H7-114349 proposes that, by a user touching a function key displayed in a display section, a function designated by the function key displayed in the display section is executed. Japanese Patent Application Laid-Open No. 2002-82133 displays that, while a displayed waveform is observed, an operation of inputting a comment or a marking by pen-input is performed using a pen-input touch screen.

There has been a request as the need for the waveform observing apparatus to rapidly enlarge and reduce a displayed waveform even when the waveform observing apparatus repeatedly stops and starts collection of measured data, while leaving measured data before stoppage on the screen of the display section. In the case of responding to this first request, it is desired that, when collection of measured data is once stopped and then resumed, a boundary between the stoppage and the resuming be seen in a display on the screen. Naturally, the number of pieces of measured data storable in the waveform observing apparatus is finite, and hence it is not preferable to make a display including measured data having already been deleted.

An object of the present invention is to provide a waveform observing apparatus capable of facilitating management of compressed data and measured data which were created for a reduced display in making the reduced display, to facilitate deletion of compressed data corresponding to measured data at the time of deleting the measured data.

A further object of the present invention is to provide a waveform observing apparatus capable of reducing a calculating amount in making a reduced display so as to improve response to the reduced display.

A further object of the present invention is to provide a waveform observing apparatus capable of displaying a boundary between stoppage and start of collection of measured data in a visually observable manner when a reduced display is made.

SUMMARY OF THE INVENTION

In order to solve the above-described technical problems, the present invention basically provides a waveform observing apparatus, including
a buffer memory for temporarily storing sampled measured data,
a measured data file creating device for creating a measured data file in a body memory in a predetermined filing creation cycle, to house measured data temporarily stored in the buffer memory, and
a display section for displaying measured data in waveform, the apparatus including;
a device for processing measured data immediately before stoppage, which houses measured data, temporarily stored in the buffer memory immediately before stoppage of the sampling and not housed in the measured data file, into a file for measured data immediately before stoppage that is created in the body memory at the time of stoppage of the sampling;
a compression ratio setting device for setting a compression ratio at which a waveform to be displayed in the display section is reduced and displayed;
a compressed data calculating device for calculating compressed data based upon the number of pieces of measured data required for drawing one display dot in the display section correspondingly to the compression ratio, from measured data temporarily stored in the buffer memory with respect to each number of pieces of data;
a compressed-data file for display creating device for creating a compressed-data file for display in the body memory;
a compressed data storing device for putting and storing the compressed data calculated by the compressed data calculating device into the compressed-data file for display;
a final compressed data processing device for calculating final compressed data immediately before stoppage of the sampling based upon the measured data of a fraction temporarily stored in the buffer memory immediately before stoppage of the sampling and not housed in the compressed-data file for display, to put and store the calculated data into the compressed-data file for display;
a device for calculating the number of pieces of difference data, which calculates the number of pieces of difference data between the number of pieces of data used for calculating the compressed data immediately before stoppage of the sampling and the number of pieces of measured data required for drawing one display dot correspondingly to the compression ratio when the sampling is resumed; and
a top compressed data processing device, which calculates top compressed data processing device immediately after resuming of the sampling based upon measured data in the number of pieces of difference data when the number of pieces of measured data temporarily stored in the buffer memory immediately after resuming of the sampling reaches the number of pieces of difference data, to put and store the calculated data into the compressed-data file for display.

According to the present invention, when the sampling is stopped and resumed, measured data temporarily stored in a buffer memory is housed in a file for measured data immediately before stoppage, and also as for compressed data for a reduced display, final compressed data is calculated based upon measured data temporarily stored at the time of stoppage of the sampling, and then housed in a compressed-data file for display, thereby facilitating deletion of measured data by units of files from the waveform observing apparatus, and also facilitating deletion of compressed data in accordance with the deletion of the measured data at the time of deleting the measured data.

The waveform observing apparatus according to the embodiment of the present invention includes:

a compressed data file selecting device for preparing a plurality of compressed-data file for displays with different compression ratios, to select the compressed-data file for display with a smaller compression ratio than the compression ratio the setting of which was changed by the compression ratio setting device; and a recompressed data calculating device for calculating recompressed data for drawing the one display dot at the compression ratio after the setting change based upon a plurality of pieces of compressed data in the compressed-data file for display selected by the compressed data file selecting device, wherein a reduced waveform is displayed in the display section based upon the recompressed data calculated by the recompressed data calculating device.

At the time of displaying a waveform in the display section of the waveform observing apparatus, the following processing is performed. Namely, the number of pieces of measured data required for drawing one display dot in the display section is calculated, and the maximum value and the minimum value in the measured data corresponding to each display dot are calculated and based upon these maximum value and minimum value, a line is drawn on each display dot.

In the case of making a reduced display in the waveform observing apparatus, the number of pieces of measured data required for drawing one display dot increases. Thereby, in the case of making a reduced display, it is necessary to perform processing for calculating the number of pieces of measured data required for drawing one display dot at a compression ratio set by the user, to calculate the maximum value and the minimum value in measured data corresponding to each display dot, and this processing is time consuming.

According to the embodiment of the present invention, even when a setting change regarding the compression ratio of the reduced display is made, compressed data corresponding to the compression ratio after the setting change can be calculated using already calculated data, to reduce a calculating amount for calculating compressed data required for drawing one display dot, so as to improve response of the reduced display.

The waveform observing apparatus according to the embodiment of the present invention includes:

an interpolation processing device for performing interpolation processing to make drawing between the one display dot and a next display dot have continuity; and an interpolation processing canceling device for canceling the interpolation processing by the interpolation processing device when the final compressed data and the top compressed data are to be displayed in the display section.

According to the present embodiment, since interpolation processing for holding continuity of drawing between the one display dot and a next display dot in making a reduced display is cancelled at the time between stoppage and resuming of the sampling, discontinuity appears in the waveform of the reduced display, and by visually observing this discontinuous portion, the user can immediately see that is the portion where the sample was stopped and resumed. In other words, the reduced display can be made in substantially the same display mode as that of the conventional chart.

BRIEF DESCRIPTION OF THE DRAWINGS

FIG. 8 is a list as an exemplification representing the number of pieces of data required for drawing a display dot based upon the relation between the sampling cycle and the compression ratio;

DESCRIPTION OF THE PREFERRED EMBODIMENTS

Figure 1:
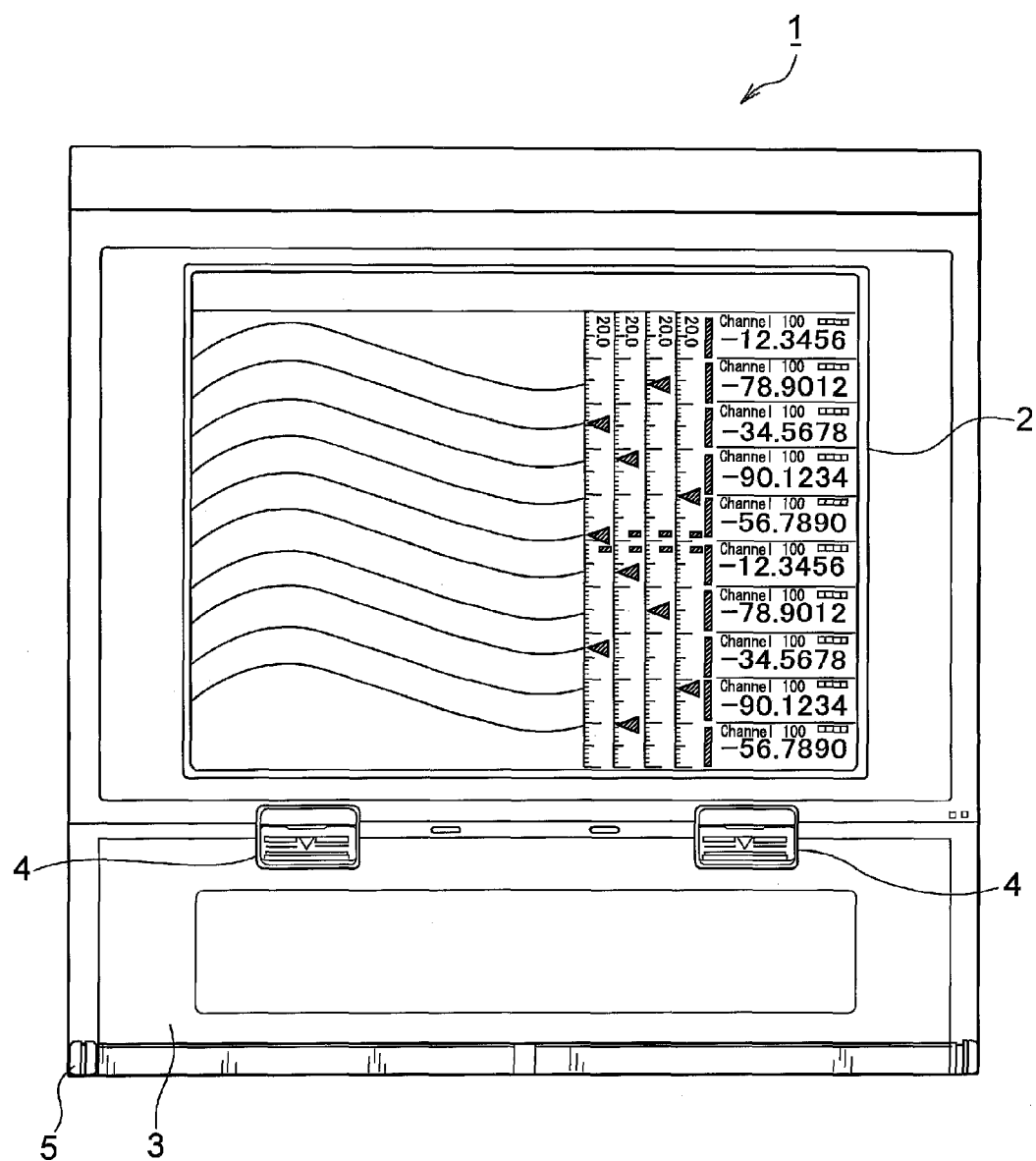
FIG. 1 is a front view of a waveform observing apparatus of an embodiment.
Figure 2:
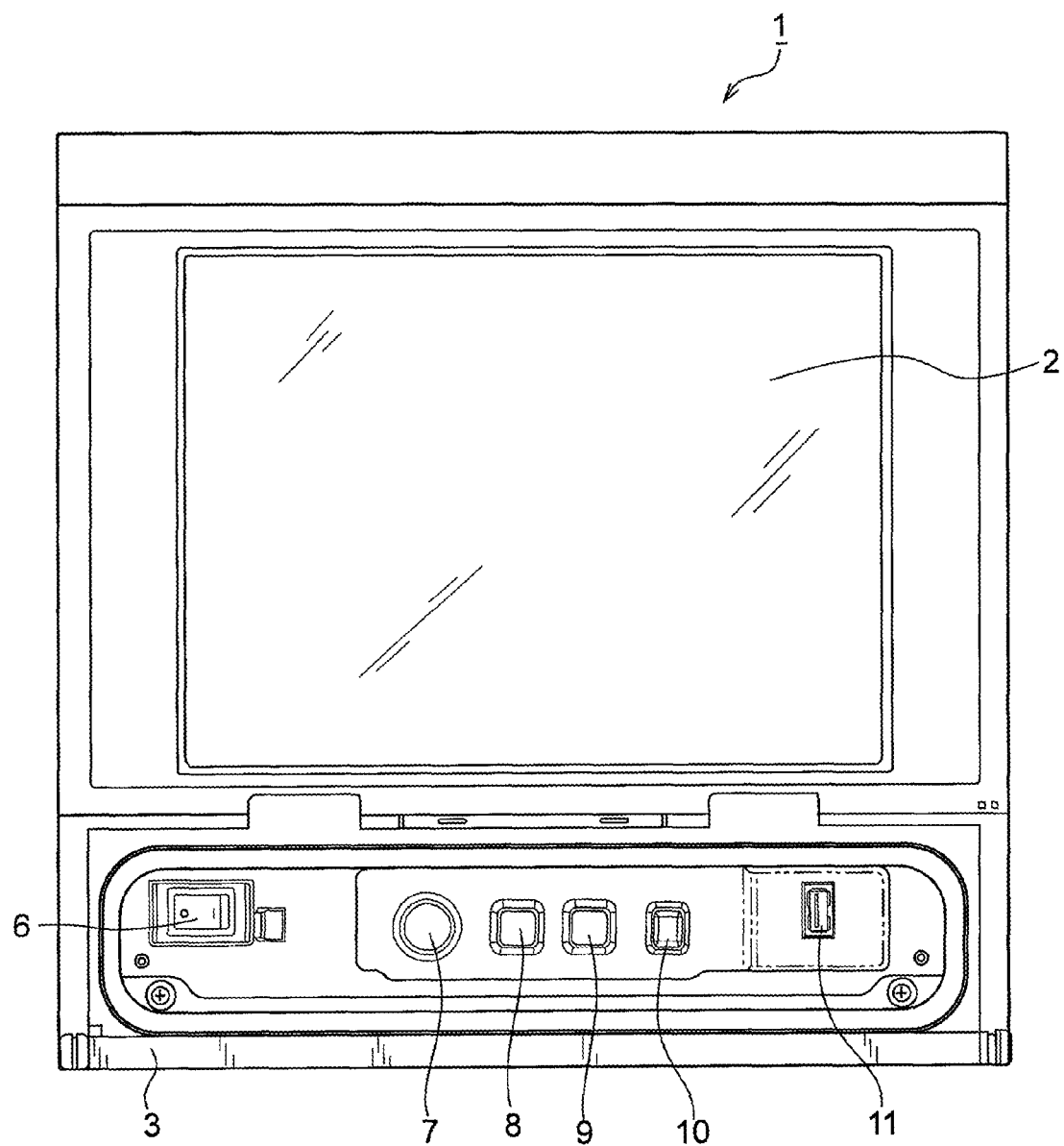
FIG. 2 is a front view of the waveform observing apparatus of the embodiment as in FIG. 1, as well as a view showing a state in which a waterproof cover provided under a display is open.

In the following, a preferred embodiment of the present invention is described with reference to attached drawings. FIG. 1 is a front view of a waveform observing apparatus 1 of an embodiment. The waveform observing apparatus 1 has a top-open waterproof cover 3 with a lower hinge below a display section 2, and the waterproof cover 3 can be opened with a lower hinge 5 at the center by releasing a slide lock 4. FIG. 2 shows a state where the waterproof cover 3 is opened. As seen from this FIG. 2, a main power switch 6, a start/stop switch button 7, a setting menu button 8, a user key button 9, a touch panel function lock switch button 10, and a USB connector 11 are exposed by opening the water proof cover 3.

Figure 3:
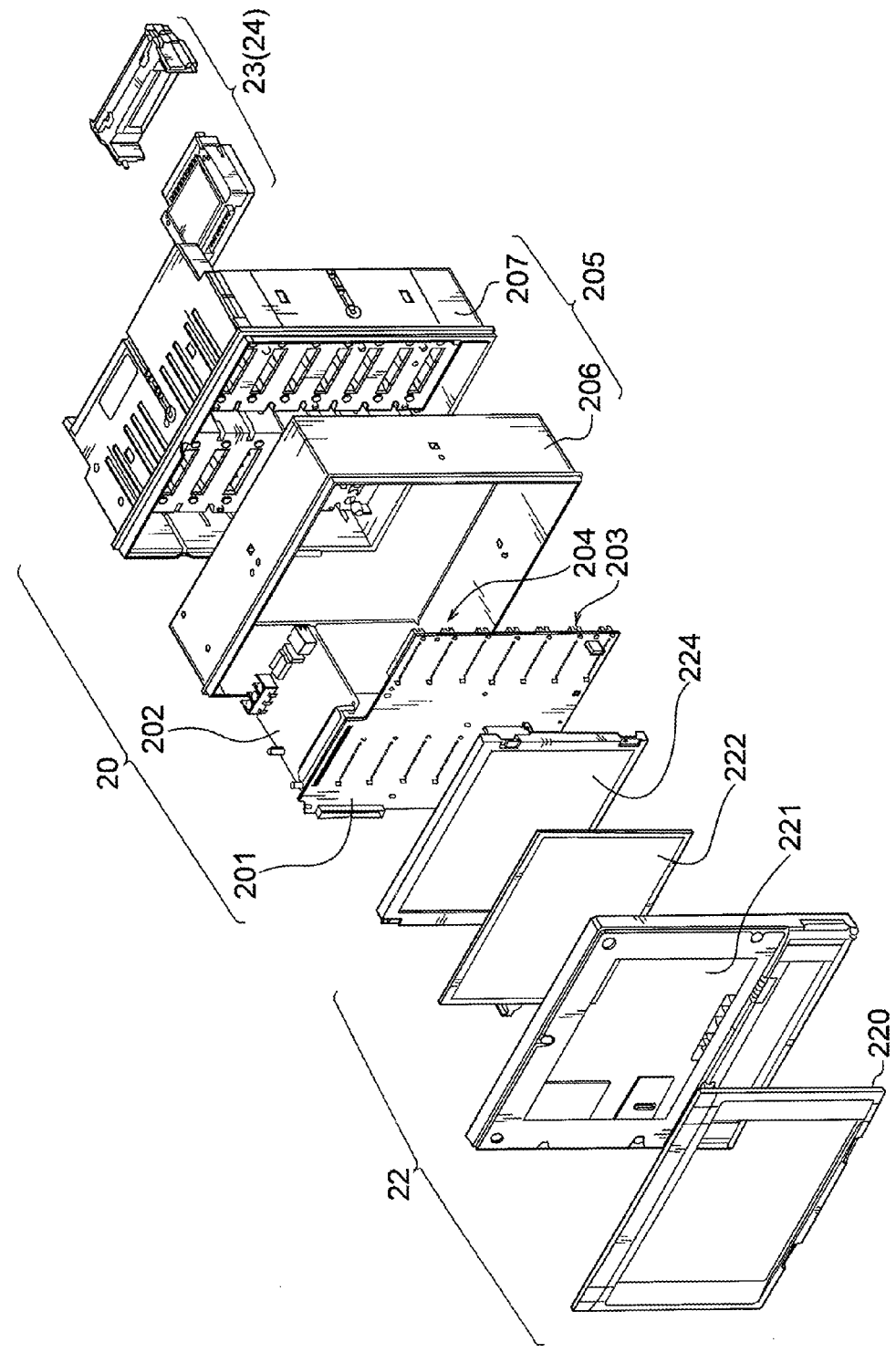
FIG. 3 is an exploded perspective view of the waveform observing apparatus of the embodiment.
Figure 4:
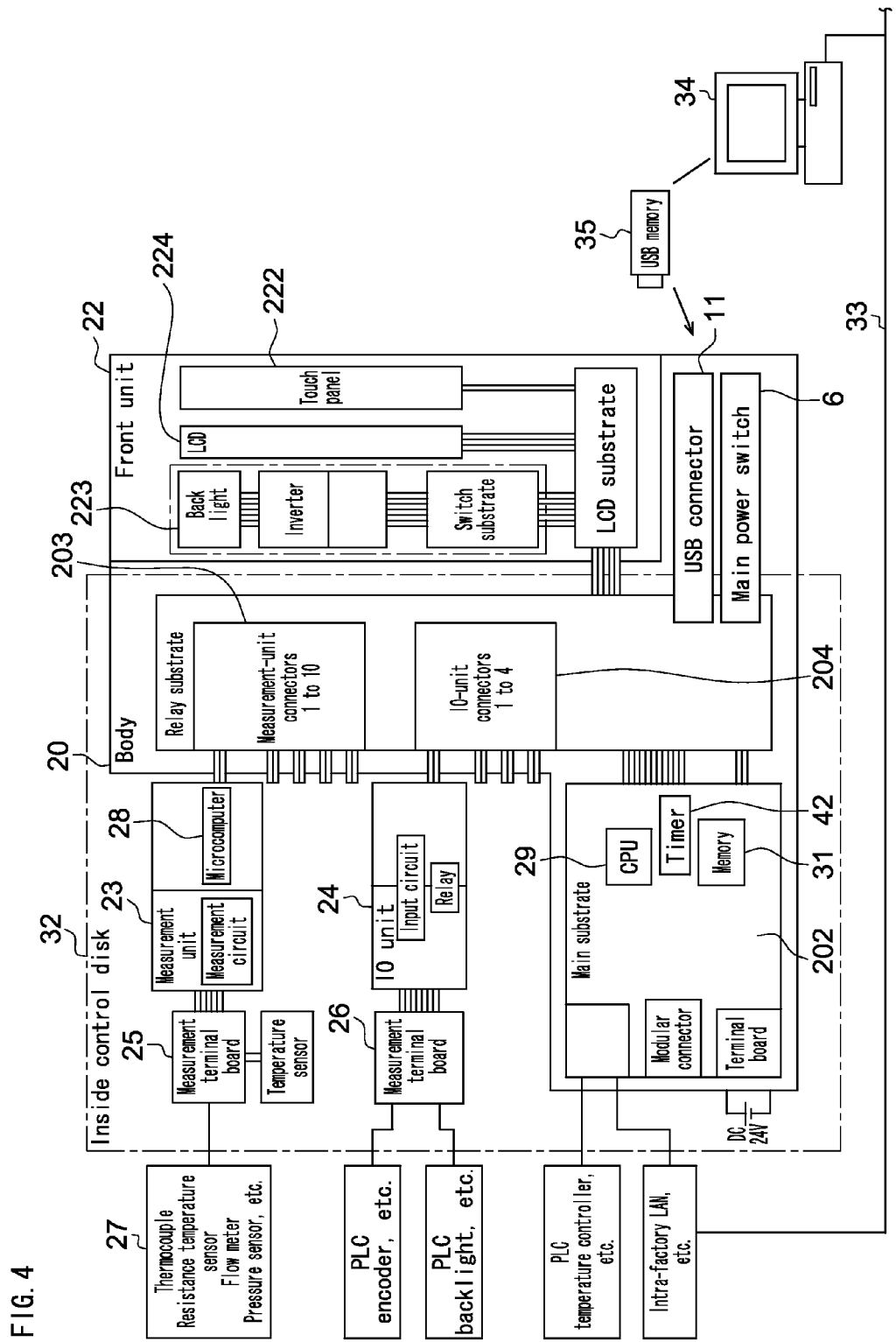
FIG. 4 is a block diagram of the waveform observing apparatus of the embodiment.

FIG. 3 is an exploded perspective view of the waveform observing apparatus 1, and FIG. 4 is a block diagram of the same. The waveform observing apparatus 1 has a body 20 and a detachable front unit 22 on the front surface of this body 20. The front unit 22 is made up of a cosmetic panel 220, a front surface frame 221, a touch panel 222, and a liquid display 224 having a back light 223 (FIG. 4). The touch panel 222 and the liquid display 224 with the back light constitute the display section 2, and a waveform chart is displayed in the display section 2 as in the figure.

The body 20 has a relay substrate 201 located on its front surface in an erect state, and a main substrate 202 that is connected to the upper end of the relay substrate 201 and horizontally extends. The relay substrate 201 is installed with ten measurement-unit connectors 203 and four IO-unit connectors 204. The relay substrate 201 and the main substrate 202 are housed inside a body case 205.

The body case 205 is made up of a metal-made outer case 206 and an inner plastic case 207, and in the plastic case 207, multistage shelves in two right and left columns for housing measurement units 23 and IO units 24 are formed. The measurement unit 23 and the IO unit 24 can be connector-connected by being inserted into the shelves of the plastic case 207 from its rear side. Namely, the relay substrate 201 that is located in the erect state ahead of the plastic case 207 is installed with the connectors 203, 204 in positions associated with the respective shelves of the plastic case 207, and the measurement units 23 or the IO units 24 can be connector-connected by being inserted into the respective shelves of the plastic case 207. Adopting such a configuration can reduce the size of the waveform observing apparatus 1.

The measurement unit 23 and the IO unit 24 are respectively installed with terminal boards 25, 26 on the rear surfaces thereof (FIG. 4), and the terminal board 25 of the measurement unit 23 is wire-connected with a variety of sensors 27 such as a thermocouple, a resistance temperature sensor, a flow meter and a pressure sensor. Upon receipt of a signal from the sensor 27, an intra-unit microcomputer 28 communicates with a CPU 29 of the main substrate 202 through the relay substrate 201, and transmits measured data received from the sensor 27 to the main substrate 202.

The CPU 29 of the main substrate 202 performs signal processing in accordance with a predetermined program, to store the measured data into a body memory 31 in a predetermined cycle, and also generates an image signal for controlling drawing in the display section 2. The main substrate 202 and the display section 2 are connected with each other through the relay substrate 201. When the user touches the touch panel 222, a touched position signal, or a coordinate signal, corresponding to the touch is supplied from the touch panel 222 to the CPU 29 of the main substrate 202, and the CPU 29 realizes a function meant by a key corresponding to the touched place, or generates a signal for executing scroll of a waveform on display in the display section 2 based upon the coordinate signal.

The waveform observing apparatus 1 is installed into a control box 32 (FIG. 4) at the factory and can be connected to a personal computer 34 through an intra-factory LAN 33. The personal computer 34 can display the same waveform as the waveform on display in the waveform observing apparatus 1. Further, a copy of data stored in the body memory 31 of the waveform observing apparatus 1 can be retrieved by inserting the USB memory 35 as a removable recording medium into the USB connector 11.

Figure 5:
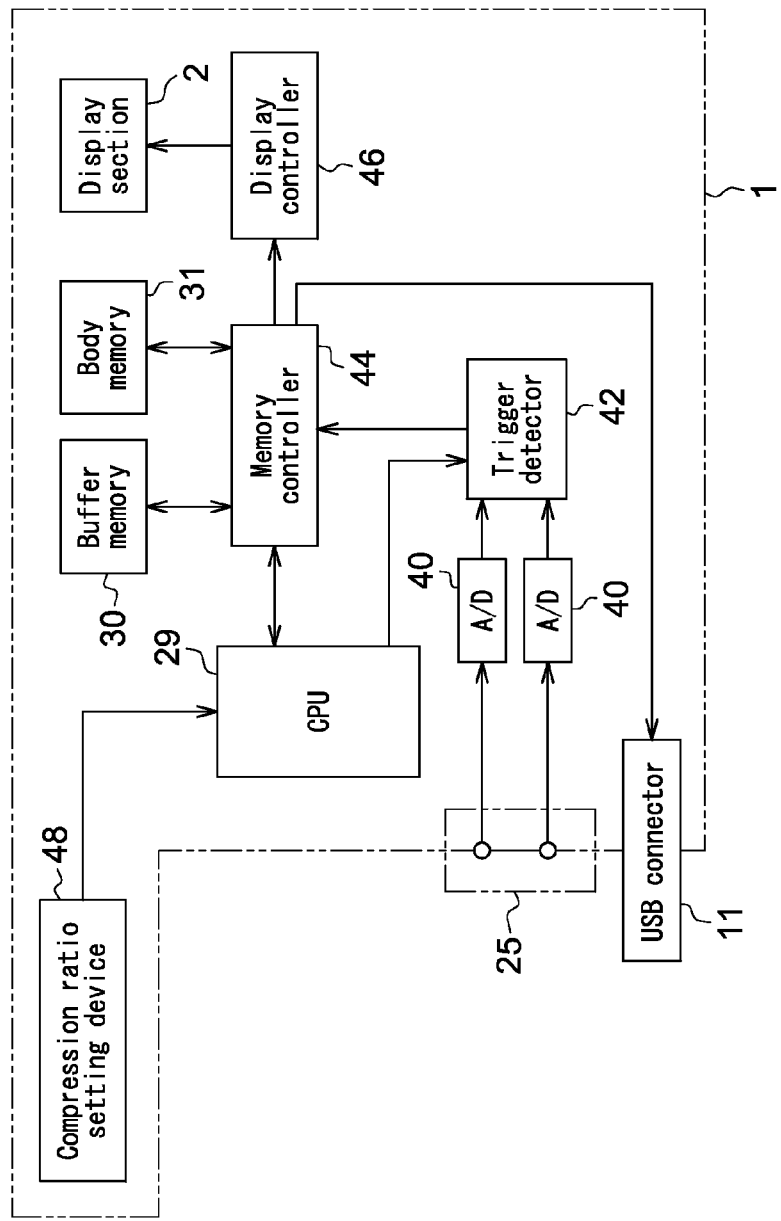
FIG. 5 is a block diagram where elements associated with reduction and display of a waveform in a display section of the waveform observing apparatus are extracted.

FIG. 5 is a block diagram of a portion associated with the waveform display of the display section 2. A measured data signal inputted from each of the variety of sensors 27 connected to the terminal board 25 is inputted into the microcomputer 28 through an A/D convertor 40 included in the measurement unit 23 (FIG. 4), and transmitted from the microcomputer 28 to the CPU 29 of the main substrate 202 in accordance with a predetermined sampling cycle selected by the user.

In the waveform observing apparatus 1, in accordance with trigger conditions settable by the user, such as a sampling cycle for capturing measured data, a variety of events or a rise, the measured data is transmitted to the memory controller 44 through a trigger detector 42 and temporarily stored into the buffer memory 30. The measured data temporarily stored in the buffer memory 30 is then stored into the body memory 31 in the state of being filed in each predetermined file creation cycle. Further, the measured data is transmitted to a display controller 46 through the memory controller 44, and displayed in waveform in the display section 2.

Although FIG. 1 shows the waveform observing apparatus 1 in a state where waveforms are displayed in the display section 2, and the waveform displayed in the display section 2 can be time-axially reduced and displayed. For example, the user can select a waveform from a menu (compression ratio setting device 48) displayable in the display section 2, so as to set a compression ratio of the waveform display.

Figure 6:
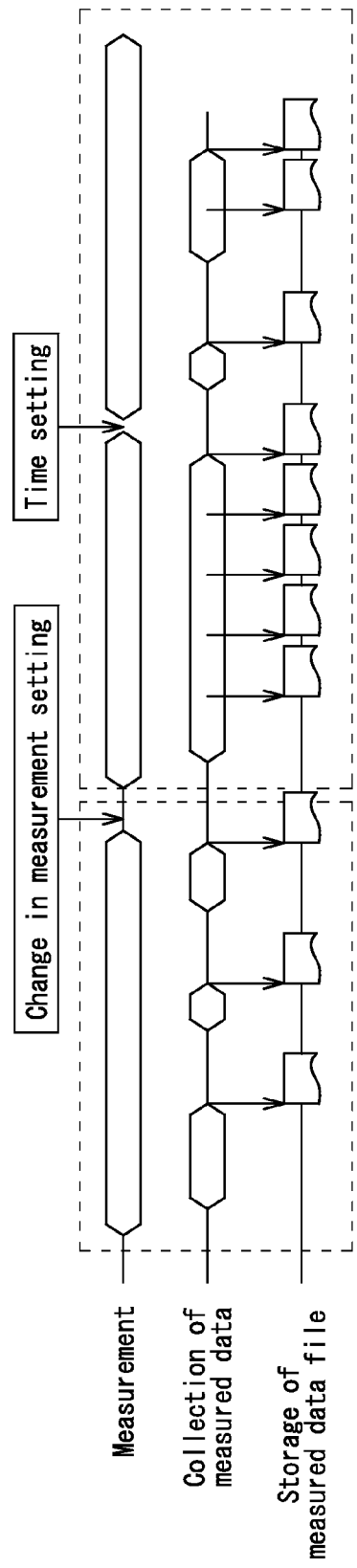
FIG. 6 is a diagram for explaining a series of processing for filing sampled measured data in a fixed filing creation cycle, and also creating additional final measured data file at the time of stoppage of the sampling.

A method for storing measured data in the waveform observing apparatus 1 of the embodiment is described with reference to FIGS. 6 and 7. Measured data is temporarily stored into the buffer memory 30 (FIG. 5). A measured data file is generated in the body memory 31 in each predetermined file creation cycle set by the user, and the measured data in the buffer memory 30 is stored into this measured data file. When sampling is stopped or a measurement setting condition is changed, a file for measured data immediately before the stoppage for housing measured data, temporarily stored in the buffer memory 30 at that time, is generated in the body memory 31, and measured data not yet filed in the buffer memory 30 is stored into this file for measured data immediately before the stoppage. This file for measured data immediately before the stoppage corresponds to a file 004 in FIG. 7. This processing constitutes a device for processing measured data immediately before the stoppage.

After the setting change of the measurement condition, a new measured data file is generated in the body memory 31 in each predetermined file generation cycle. Naturally, a serial number is given to a file name of each measured data file. With the serial number included in the file name, it is possible to know a time series of each measured data file stored in the body memory 31.

As for compressed-display measured data in the display section 2, a compressed-data file for display is generated in the body memory 31 separately from the above-mentioned measured data file. A plurality of compressed-data files for display are prepared correspondingly to a plurality of compression ratios and sampling cycles which are settable by the user.

FIG. 8 is a list as an example for explaining the number of pieces of data required for drawing one display dot in combination of the sampling cycle and the compression ratio (Time/div.). It is found from FIG. 8 that, for example in the case of the sampling cycle being set to 100 ms and Time/div. being set to 15 minutes (min.), 300 pieces of measured data are required for drawing one display dot. Therefore, when this compression ratio is set, the maximum value and the minimum value of every 300 pieces of measured data are calculated as display data, which are stored as compressed data into the compressed-data file for display.

Figure 7:
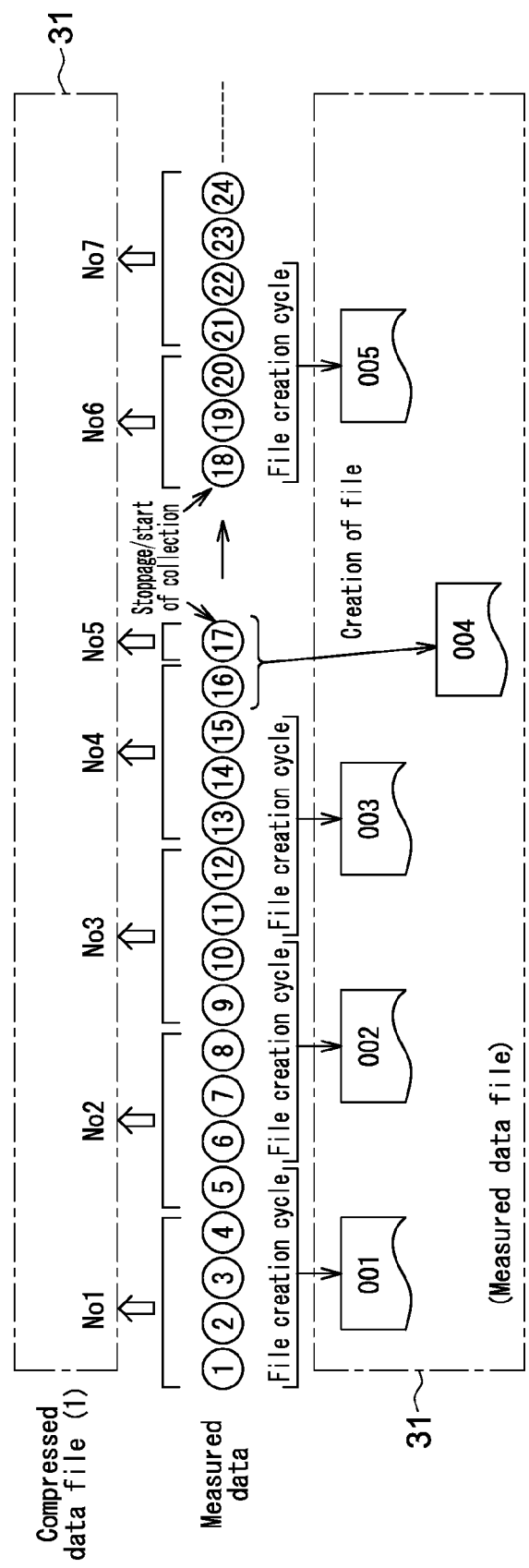
FIG. 7 is an explanatory view for explaining formation of compressed data at stoppage and immediately after sampling, along with creation of compressed data for a reduced display as well as measured-data filing.

Above FIG. 7 is a diagram for schematically explaining this. For example, when four pieces of measured data are required for drawing of one display dot, one compressed data is generated every time four measured data are stored in the buffer memory 30, and this compressed data is stored into the compressed-data file for display in the body memory 31. In the example of FIG. 7, when data collection is stopped, as for seventeenth measured data as a fraction of the buffer memory 30, fifth compressed data (final compressed data) regarding the seventeenth measured data is calculated and stored into the compressed-data file for display. Then, when the data collection is resumed, sixth compressed data (top compressed data) regarding three pieces of measured data, namely eighteenth to twentieth measured data, as the number of pieces of difference data is calculated and stored into the compressed-data file for display.

Figure 9:
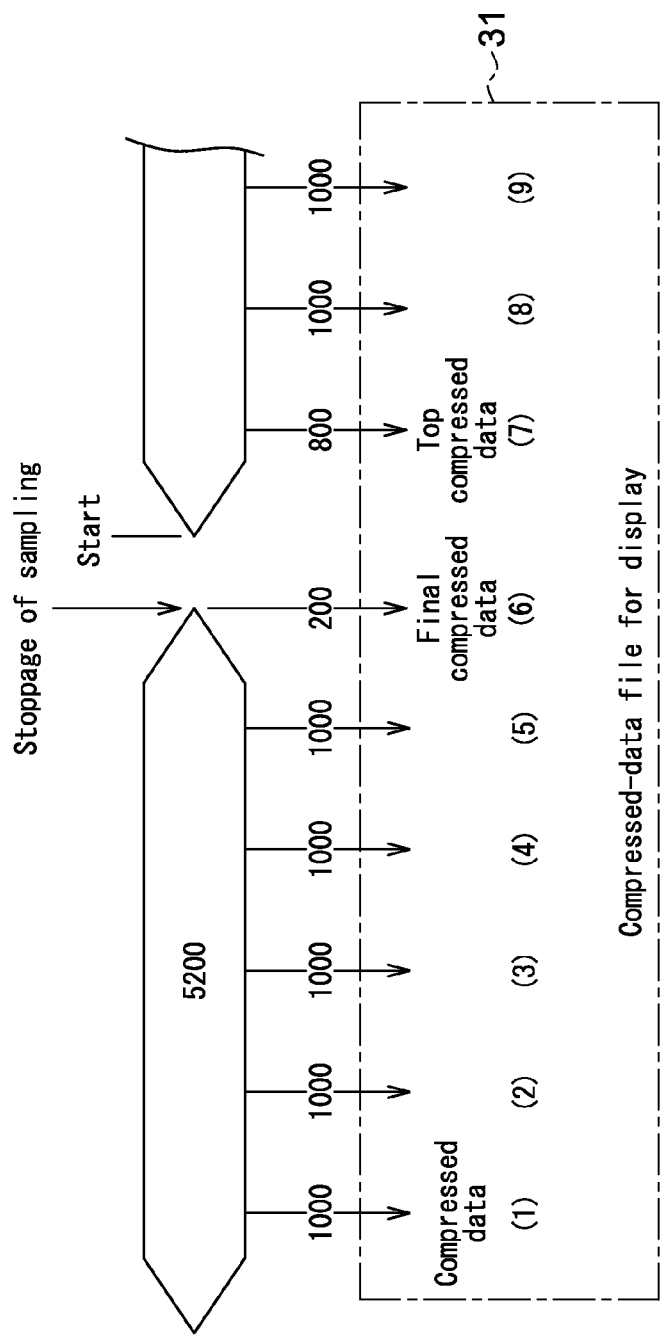
FIG. 9 is an explanatory diagram for explaining final compressed data at stoppage of sampling and top compressed data immediately after resuming of sampling.

FIG. 9 is a diagram for explaining the same as above, as well as a diagram regarding the case of a compression ratio requiring 1000 pieces of measured data for drawing one display dot. Every time 1000 pieces of compressed data are collected in the buffer memory 30, the maximum value and the minimum value thereof are calculated, and then stored as compressed data into the compressed data file, namely the compressed-data file for display. This is an example of sampling being stopped at the time of 5200 pieces of measured data. At the time when sampling is stopped, the number of pieces of data of a fraction is 200, and the maximum value and the minimum value in regard to the 200 pieces of the measured data of the fraction are calculated, and those values are stored into the compressed-data file for display as final compressed data (6). When sampling is resumed, at the time when 800 pieces of measured data are collected as data of a fraction, the maximum value and the minimum value thereof are calculated, and those values are stored into the compressed-data file for display as top compressed data (7). Subsequently, every time when 1000 pieces of measured data are collected, the maximum value and the minimum value thereof are calculated and then stored as compressed data into the compressed-data file for display.

As thus described, as compressed data in the compressed-data file, at the time of stopping the sampling, the final compressed data (6) is generated by use of measured data of a fraction which were collected immediately before the stoppage, and at the time of starting next sampling, the top compressed data (7) is generated by use of measured data of a fraction which were collected immediately after the start. Accordingly, at the time of deleting measured data in units of files, deletion of compressed data associated with the stoppage and resuming can be easily managed. To put it in other words using the above example, when the compressed data is generated based upon 1000 pieces of measured data in combination of measured data immediately before stoppage of the sampling and measured data immediately after resuming of the sampling, it is difficult to delete compressed data in line with deletion of the measured data in units of files. Meanwhile, in the reduced display based upon the compressed data, a boundary between stoppage and resuming of the sampling cannot be displayed, and it is thus necessary to display this boundary by another means.

Naturally, it is favorable that not only compressed data, namely display data, regarding the compression ratio (Time/div.) set to 15 minutes (min.) with respect to the sampling cycle set to 100 ms, but also compressed data regarding another single or plural compression ratios be generated and stored into the compressed-data file for display.

Figure 10:
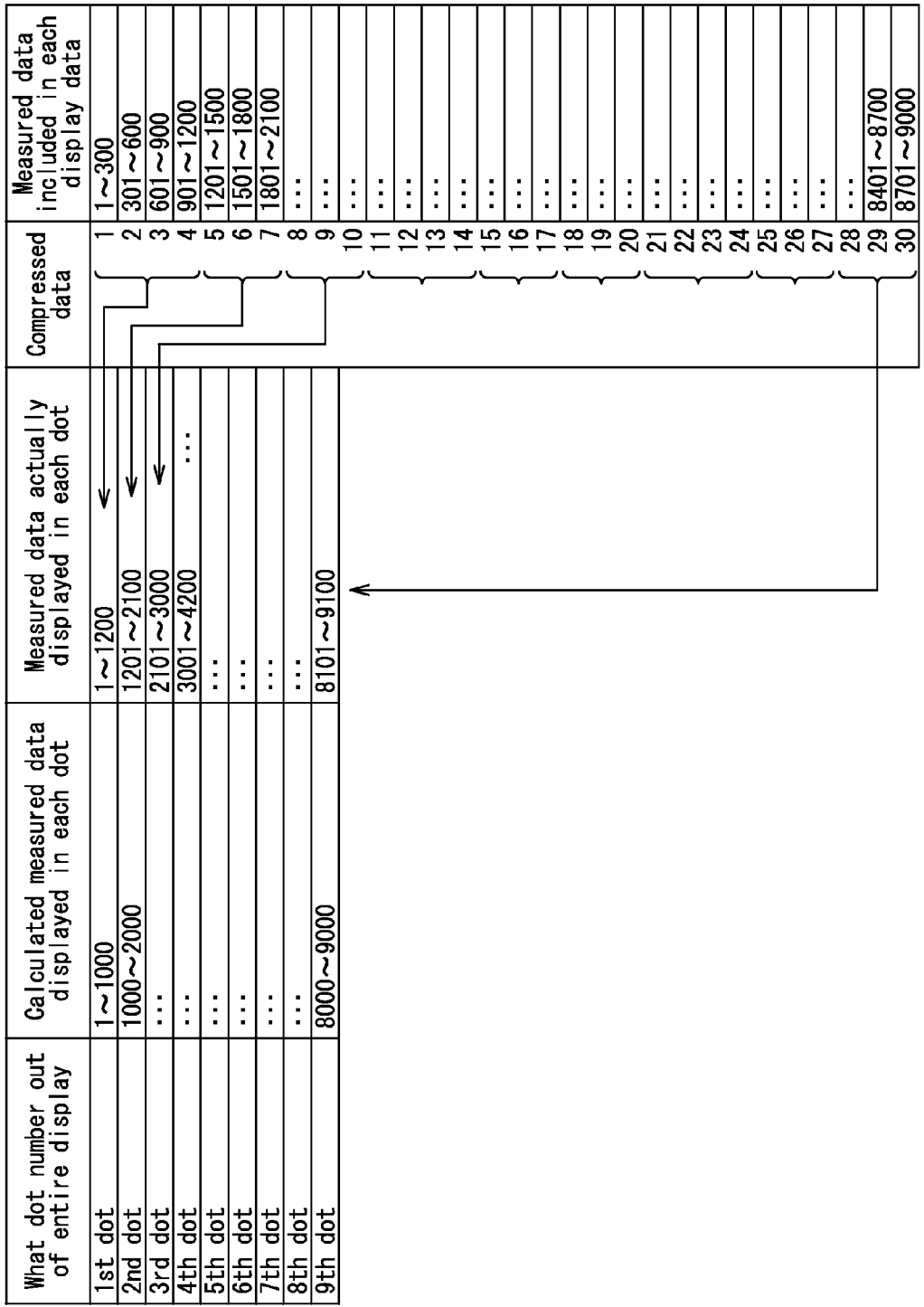
FIG. 10 is a diagram for explaining creation of compressed data at a compression ratio after changed from a plurality of pieces of compressed data at the time when setting of the compression ratio is changed.

When a plurality of compressed-data files for display with different compression ratios are prepared, as shown in FIG. 10, in a case where 1000 pieces of measured data are required with respect to one display dot for displaying a waveform by a display scaling the setting of which was changed by the user, a compressed-data file for display with a smaller compression ratio than the compression ratio requiring the 1000 pieces of data may be used to calculate display data at the compression ratio requiring the 1000 pieces of measured data.

With reference to FIG. 10 explained is an example where, in the case of displaying a waveform over the display section 2, and a compression ratio of "the number of pieces of data per display dot is 1000" is set, when a compressed-data file for display for this compression ratio is not prepared, a display is made using compressed data of a compressed-data file for display with a compression ratio of the number of pieces of data per display being smaller than 1000.

It is to be noted that, although data in the unit of 1000 pieces is compressed and displayed in the example of FIG. 10, data are present in the unit of 300 pieces of data in the example shown in the figure, where in the first 1000 pieces, four pairs of data collected in the unit of 300 pieces (1200 pieces of data) are used, and in the next 2000 pieces, three pairs of data collected in the unit of 300 pieces (900 pieces of data) are used. This is mere one example, and for example, in the first 1000 pieces, four pairs of data collected in the unit of 300 pieces of data may be used, and in the next 2000 pieces, four pairs of data from 901th data may be used. In addition, the maximum value and the minimum value of data in compression units mean the maximum value and the minimum value of data from first to 1200th data actually collected in the unit of 300 pieces.

As thus described, even when a compression ratio for which a compressed-data file for display is not prepared is set, a data file for another compression ratio can be diverted and arithmetic processing for displaying a waveform at the set compression ratio can be simplified, so as to rapidly change an image display with respect to a change in compression ratio. Display of a handwritten comment with change in compression ratio is described later.

Figure 11:
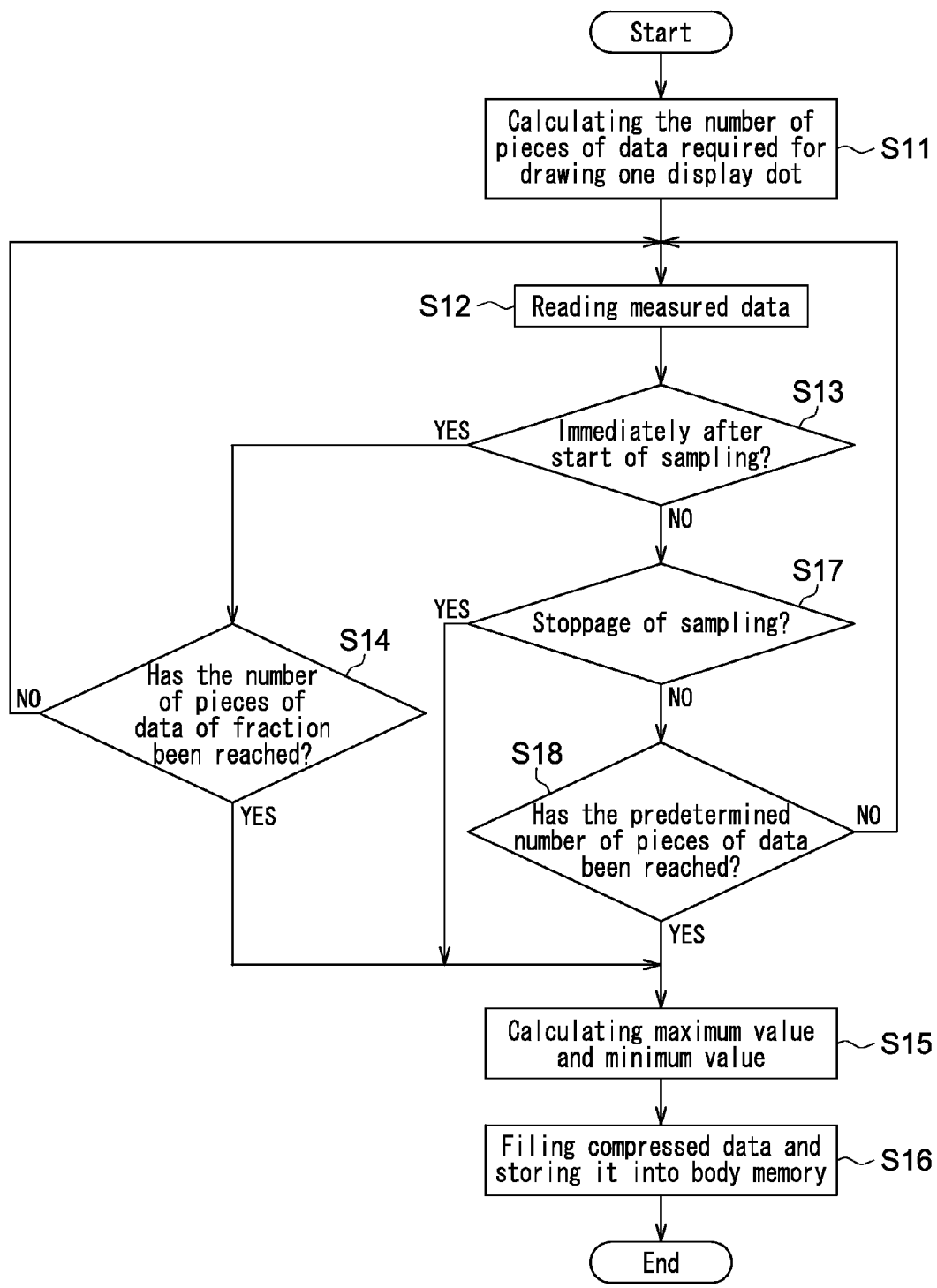
FIG. 11 is flowchart for explaining procedures for creating the compressed-data file for the reduced display.

FIG. 11 is a flowchart regarding creation of the compressed-data file for display. With reference to this FIG. 11, first, in Step S11, the number of pieces of data required for drawing one display dot at a predetermined compression ratio is calculated. Then, in next Step S12, measured data temporarily stored in the buffer memory 30 is read, and in next Step S13, it is determined whether or not to be immediately after start of sampling.

In this Step S13, when the determination is YES, namely when it is immediately after start of the sampling, the process proceeds to Step S14, and it is determined whether or not the number of pieces of data of a fraction has reached the number of pieces of data required for calculating first top compressed data immediately after start of the sampling. It should be noted that this number of pieces of data of the fraction required for calculating the top compressed data is previously calculated. When the determination is NO in above-mentioned Step S14, the process returns to Step S11, and measured data is further read. When the process again returns to Step S14 and the number of pieces of measured data not having been made into compressed data inside the buffer memory 30 reaches the number of pieces of data of the fraction, the determination is YES, and hence the process proceeds to Step S15. It is to be noted that, as for the meaning of determination of this Step S14, the above description of the top compressed data (7) immediately after stoppage and resuming of the sampling in FIG. 9 shall be referenced.

In Step S15, the maximum value and the minimum value of measured data of an object fraction are calculated to generate top compressed data, and in next Step S16, the top compressed data is stored into a corresponding compressed-data file for display. Step S16 in this series of processing constitutes a top compressed data processing device. Next, the process returns to Step S12, and measured data is read. In next Step S13, the determination is NO since the data is not one immediately after the sampling. Then, the process proceeds to Step S17, and it is determined whether or not the sampling has been stopped. When the sampling is continued, the determination is NO, and hence the process proceeds to Step S18, and it is determined whether or not the number of pieces of data has reached the predetermined number of pieces of data which was calculated in Step S11. When the number of pieces of data has not reached the predetermined number yet, the process returns to Step S12, and measured data not having been made into compressed data inside the buffer memory 30 is read. Then, when the number of pieces of measured data not having been made into compressed data reaches a predetermined number, the process proceeds to Step S15, and the maximum value and the minimum value thereof are calculated. In Step S16, the compressed data is stored into a corresponding compressed-data file for display. Step S16 in this series of processing constitutes a compressed data storing device.

In above Step S17, when the determination is YES, namely when it is determined that the sampling has been stopped, the process proceeds to Step S15, and the maximum value and the minimum value of the measured data not having been made into compressed data inside the buffer memory 30 are calculated, to create final compressed data. In next Step S16, this final compressed data is stored into a corresponding compressed-data file for display (see the above description of the final compressed data (6) in FIG. 9). Step S16 in this series of processing constitutes a final compressed data processing device.

Figure 12:
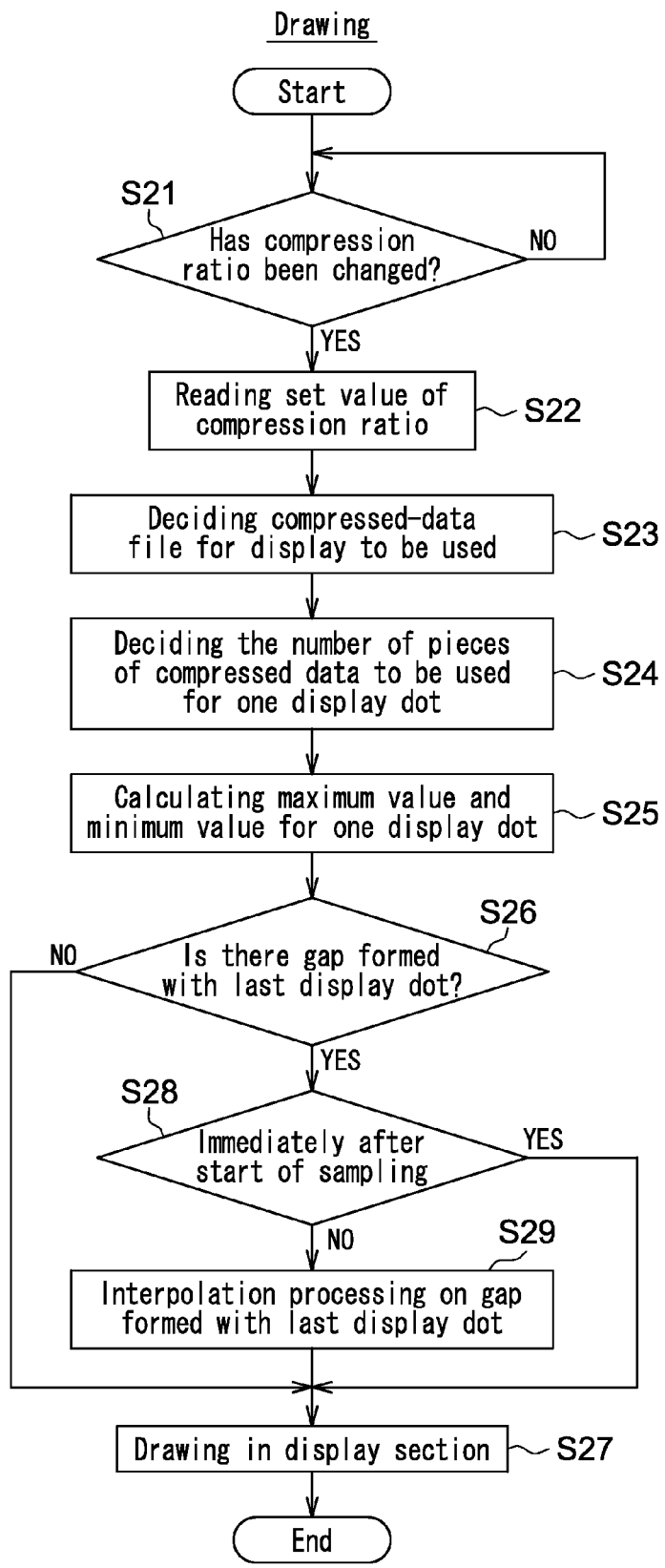
FIG. 12 is a flowchart for explaining a change in setting of the compression ratio and a series of procedures for creating compressed data in association with the change.

FIG. 12 is a flowchart for explaining an example of procedures for drawing in the display section 2 by use of the compressed-data file for display, and each step is described with reference to forgoing FIG. 10. First, it is determined in Step S21 whether or not the user has changed setting in regard to the compression ratio, and when the determination is YES (setting has been changed), the process proceeds to Step S22, and the compression ratio set by the user is read. Subsequently, in next Step S23, a compressed-data file for display to be used as display data is determined. Next, the number of pieces of compressed data to be used with respect to one display dot in the case of using the selected compressed-data file for display is decided (S24). In the case of the example of FIG. 10, this number of pieces of compressed data corresponds to four pieces of compressed data in regard to a first dot, and corresponds to three pieces of compressed data in regard to a second dot and dots subsequent thereto. Then, in next Step S25, the maximum value and the minimum value in regard to each display dot are calculated, to create recompressed data. This processing constitutes a recompressed data calculating device.

Next, in Step S26, the presence or absence of a gap formed with the last display dot is determined. When there seems to be continuity, the determination is NO. Hence the process proceeds to Step S27, and drawing is performed in the display section 2. On the other hand, when in Step S26 the determination is YES, namely when it is determined a gap formed with the last display dot is present, the process proceeds to Step S28, and it is determined whether or not the gap is one regarding a display dot immediately after stoppage and resuming of the sampling. When the determination is NO, the process proceeds to Step S29, and interpolation processing for filling the gap formed with the last display dot is performed. Thereafter, the process proceeds to Step S27, and drawing is performed in the display section 2. This series of processing constitutes an interpolation processing device. On the other hand, when the gap is one regarding a display dot immediately after stoppage and resuming of the sampling in Step S28, the determination is YES, and hence the interpolation processing (S29) is cancelled. The process proceeds to above Step S27 without performing the processing for filling the gap formed with the last display dot, and drawing is performed in the display section 2. This series of processing constitutes an interpolation processing canceling device.

Figure 13:
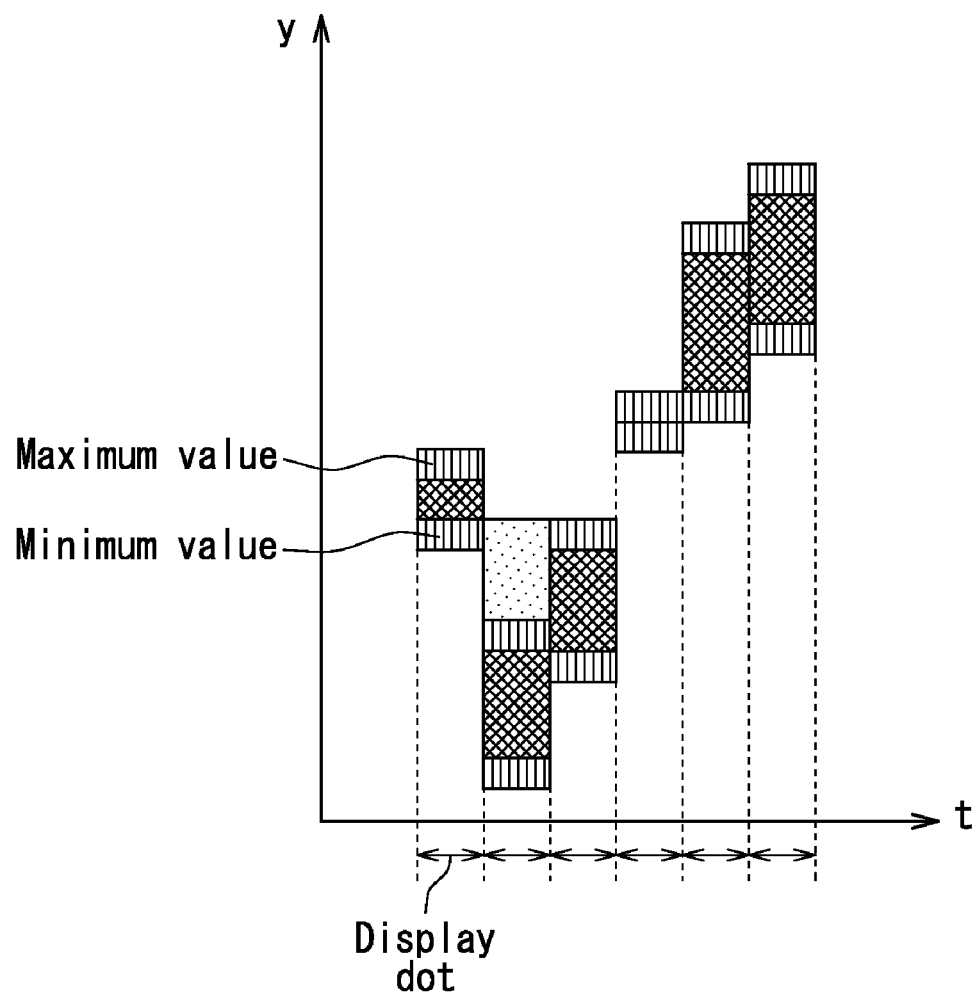
FIG. 13 is a view showing one mode of the reduced display.
Figure 14:
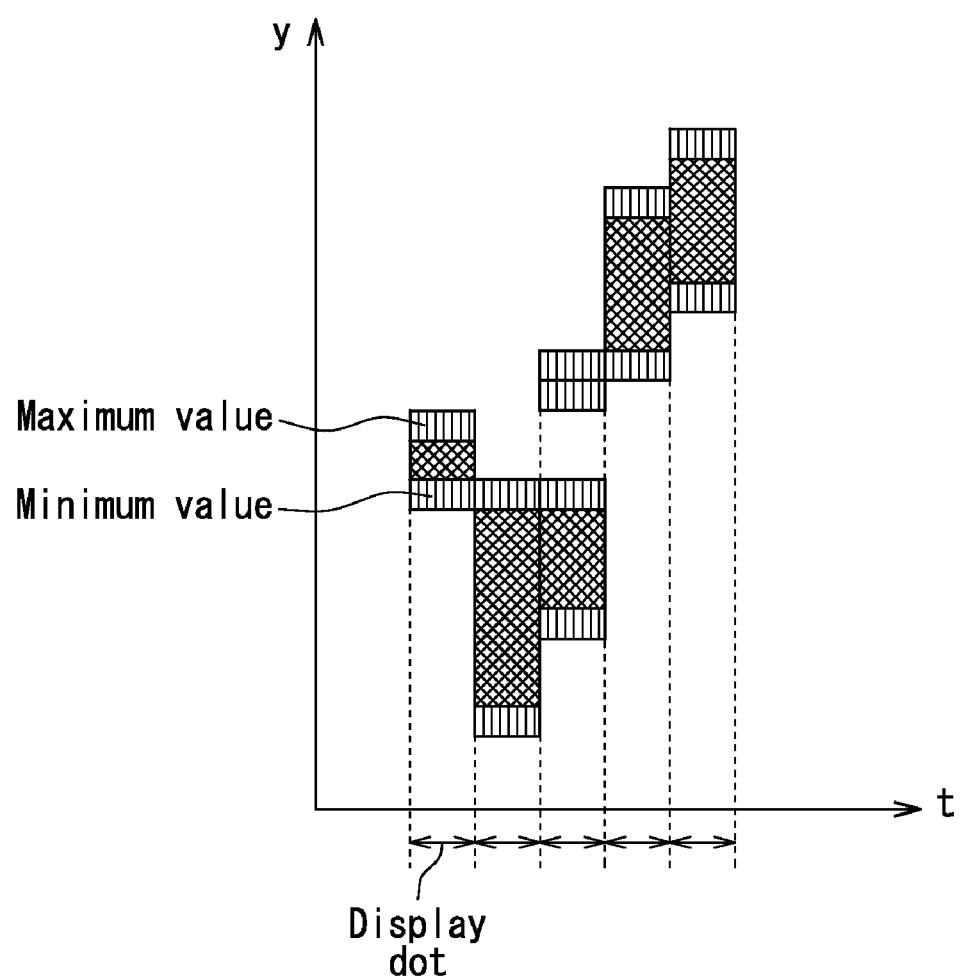
FIG. 14 is a view showing another mode of the reduced display.

FIGS. 13 to 16 show some examples of the display mode of the display section 2. A portion indicated by a plurality of dotted marks in FIG. 13 is a portion subjected to the interpolation processing of above Step S29. Further, portions indicated by a plurality of vertical lines are maximum values or minimum values. The display dots are drawn continuously due to the interpolation processing of above Step S29, but a portion where the sampling was stopped and started in the middle of the process is discontinuous due to cancellation of above Step S29, whereby the user can visually see the discontinuous portions that appear in the display section 2, to immediately know that is the portion where the sample was stopped and started. In other words, substantially the same display mode as that of the conventional chart can be provided, which is advantageous for the user familiar with the conventional chart. Further, supposing that the portion where the sampling was stopped and started is also continuously displayed, it is necessary to exercise another display device on the portion where the sampling was stopped and started so as to allow the user to see that portion.

In the display example of FIG. 13, in regard to the portion where the sampling is stopped and started, a display is made with one-dot difference between the stoppage and start. In the display example of FIG. 14, in regard to the portion where the sampling was stopped and started, a display is made in the same display-dot portion.

Figure 15:
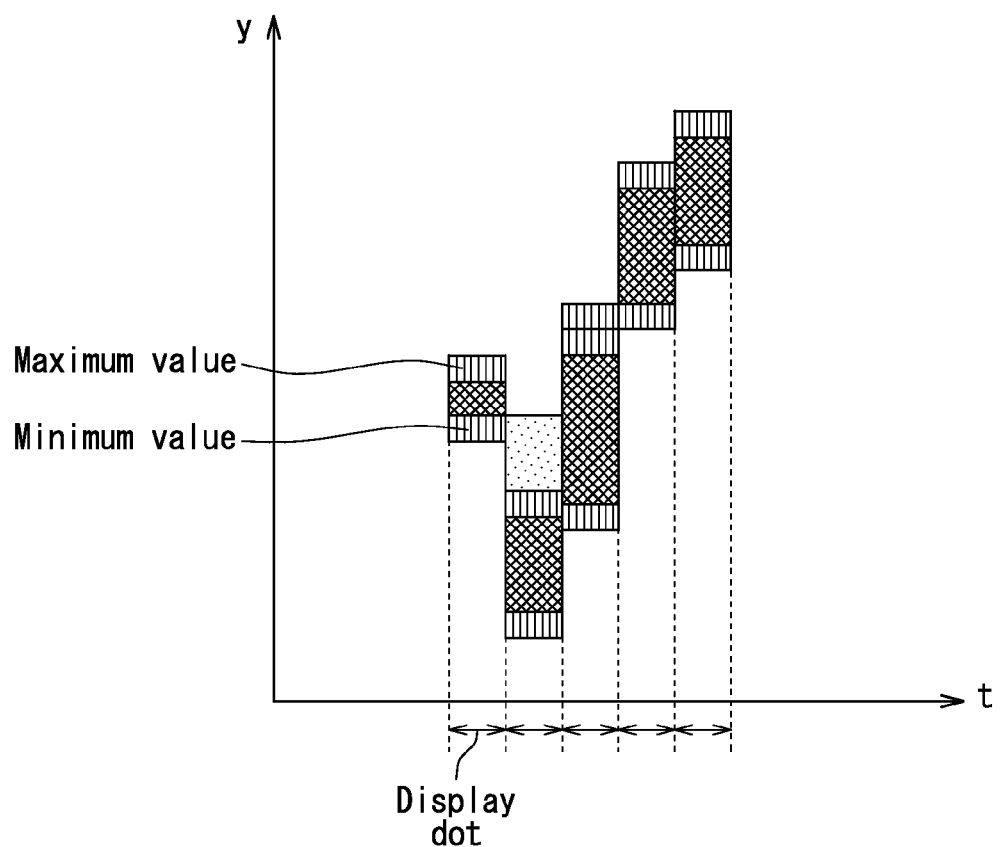
FIG. 15 is a view showing a different mode of the reduced display.
Figure 16:
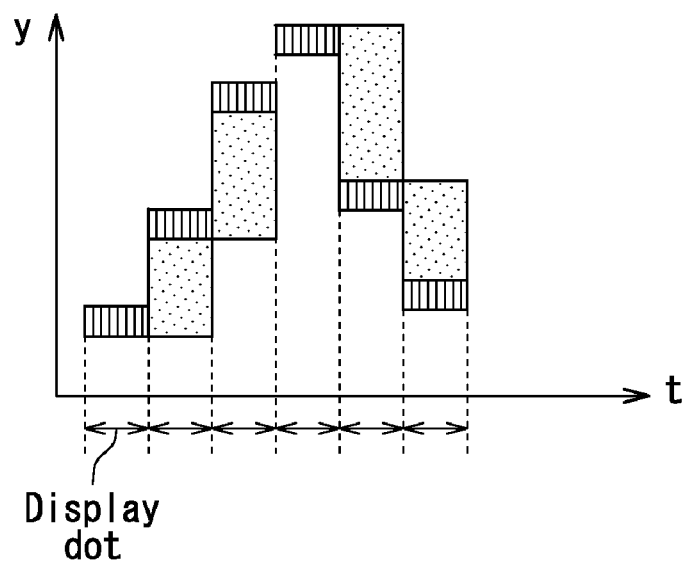
FIG. 16 is a view showing further different mode of the reduced display.

The display example of FIG. 15 shows a case where, when displays are made in the same display-dot portion in regard to the portion where the sampling was stopped and started, the maximum value and the minimum values immediately before the stoppage and immediately after the start are overlapped. The area of the maximum value portion increases as seen from FIG. 15, thereby enabling visual recognition that this is a portion where the sampling was stopped and started. The display example of FIG. 16 shows an example where one piece of data is shown with respect to each display dot.

What is claimed is:
1. A waveform observing apparatus, comprising
a buffer memory for temporarily storing sampled measured data,
a measured data file creating device for creating a measured data file in a body memory in a predetermined filing creation cycle, to house measured data temporarily stored in the buffer memory, and
a display section for displaying measured data in waveform, the apparatus including;
a device for processing measured data immediately before stoppage, which houses measured data, temporarily stored in the buffer memory immediately before stoppage of the sampling and not housed in the measured data file, into a file for measured data immediately before stoppage that is created in the body memory at the time of stoppage of the sampling;
a compression ratio setting device for setting a compression ratio at which a waveform to be displayed in the display section is reduced and displayed;
a compressed data calculating device for calculating compressed data based upon the number of pieces of measured data required for drawing one display dot in the display section correspondingly to the compression ratio, from measured data temporarily stored in the buffer memory with respect to each number of pieces of data;

a compressed-data file for display creating device for creating a compressed-data file for display in the body memory;

a compressed data storing device for putting and storing the compressed data calculated by the compressed data calculating device into the compressed-data file for display;

a final compressed data processing device for calculating final compressed data immediately before stoppage of the sampling based upon the measured data of a fraction temporarily stored in the buffer memory immediately before stoppage of the sampling and not housed in the compressed-data file for display, to put and store the calculated data into the compressed-data file for display;

a device for calculating the number of pieces of difference data, which calculates the number of pieces of difference data between the number of pieces of data used for calculating the compressed data immediately before stoppage of the sampling and the number of pieces of measured data required for drawing one display dot correspondingly to the compression ratio when the sampling is resumed; and a top compressed data processing device, which calculates top compressed data processing device immediately after resuming of the sampling based upon measured data in the number of pieces of difference data when the number of pieces of measured data temporarily stored in the buffer memory immediately after resuming of the sampling reaches the number of pieces of difference data, to put and store the calculated data into the compressed-data file for display.

2. The waveform observing apparatus according to claim 1, including:

a compressed data file selecting device for preparing a plurality of compressed-data files for display with different compression ratios, to select the compressed-data file for display with a smaller compression ratio than the compression ratio the setting of which was changed by the compression ratio setting device; and a recompressed data calculating device for calculating recompressed data for drawing the one display dot at the compression ratio after the setting change based upon a plurality of pieces of compressed data in the compressed-data file for display selected by the compressed data file selecting device, wherein a reduced waveform is displayed in the display section based upon the recompressed data calculated by the recompressed data calculating device.

3. The waveform observing apparatus according to claim 2, including:

an interpolation processing device for performing interpolation processing to make drawing between the one display dot and a next display dot have continuity; and an interpolation processing canceling device for canceling the interpolation processing by the interpolation processing device when the final compressed data and the top compressed data are to be displayed in the display section.

* * * * *